(12) United States Patent
Svoiski

(10) Patent No.: US 7,886,176 B1
(45) Date of Patent: Feb. 8, 2011

(54) DDR MEMORY SYSTEM FOR MEASURING A CLOCK SIGNAL BY IDENTIFYING A DELAY VALUE CORRESPONDING TO A CHANGED LOGIC STATE DURING CLOCK SIGNAL TRANSITIONS

(75) Inventor: Mikhail Svoiski, Ottawa (CA)

(73) Assignee: Integrated Device Technology, Inc., San Jose, CA (US)

( * ) Notice: Subject to any disclaimer, the term of this patent is extended or adjusted under 35 U.S.C. 154(b) by 622 days.

(21) Appl. No.: 11/860,110

(22) Filed: Sep. 24, 2007

(51) Int. Cl.
*G06F 1/12* (2006.01)
(52) U.S. Cl. .................. 713/401; 327/158; 365/233.13
(58) Field of Classification Search ................. 327/158; 713/401
See application file for complete search history.

(56) References Cited

U.S. PATENT DOCUMENTS

| | | | |
|---|---|---|---|
| 4,606,002 A | 8/1986 | Waisman et al. | |
| 5,430,869 A | 7/1995 | Ishak et al. | |
| 5,446,887 A | 8/1995 | Berkowitz | |
| 5,475,837 A | 12/1995 | Ishak et al. | |
| 5,560,007 A | 9/1996 | Thai | |
| 5,644,763 A | 7/1997 | Roy | |
| 5,666,494 A | 9/1997 | Mote, Jr. | |
| 5,758,356 A | 5/1998 | Hara et al. | |
| 5,787,430 A | 7/1998 | Doeringer et al. | |
| 5,813,000 A | 9/1998 | Furlani | |
| 5,822,749 A | 10/1998 | Agarwal | |
| 5,897,655 A | 4/1999 | Mallick | |
| 5,918,245 A | 6/1999 | Yung | |
| 5,924,115 A | 7/1999 | Von Herzen et al. | |
| 6,098,150 A | 8/2000 | Brethour et al. | |
| 6,115,792 A | 9/2000 | Tran | |
| 6,219,662 B1 | 4/2001 | Fuh et al. | |
| 6,389,507 B1 | 5/2002 | Sherman | |
| 6,401,117 B1 | 6/2002 | Narad et al. | |
| 6,404,752 B1 | 6/2002 | Allen, Jr. et al. | |

(Continued)

FOREIGN PATENT DOCUMENTS

WO   WO2004088548 A1   10/2004

OTHER PUBLICATIONS

Aggarwal et al. "A Model for Hierarchical Memory" *Proceedings of the Nineteenth Annual ACM Conference on Theory of Computing STOC* pp. 305-314 (1987).

(Continued)

*Primary Examiner*—Albert Wang
(74) *Attorney, Agent, or Firm*—Myers, Bigel, et al

(57) ABSTRACT

Circuits for measuring a clock signal include a variable digital delay line that is configured to delay the clock signal by variable amounts in response to variable values of a digital control word that are applied thereto, to produce a variably delayed clock signal. A capture stage is responsive to the variably delayed clock signal and to the clock signal to capture a logic state of the variably delayed clock signal during transitions of the clock signal. A controller is configured to generate the variable values of the digital control word that are applied to the variable digital delay line and to identify a value of the digital control word in response to the capture stage capturing a change in the logic state of the variably delayed clock signal during a transition of the clock signal. Related methods and memory devices are also described.

7 Claims, 6 Drawing Sheets

U.S. PATENT DOCUMENTS

| | | |
|---|---|---|
| 6,421,730 B1 | 7/2002 | Harad et al. |
| 6,430,527 B1 | 8/2002 | Waters et al. |
| 6,441,053 B1 | 8/2002 | Klein et al. |
| 6,460,112 B1 | 10/2002 | Srinivasan et al. |
| 6,460,120 B1 | 10/2002 | Bass et al. |
| 6,490,592 B1 | 12/2002 | St. Denis et al. |
| 6,509,762 B1 * | 1/2003 | Moss et al. .................. 327/12 |
| 6,522,632 B1 | 2/2003 | Waters et al. |
| 6,535,491 B2 | 3/2003 | Gai et al. |
| 6,539,369 B2 | 3/2003 | Brown |
| 6,553,370 B1 | 4/2003 | Andreev et al. |
| 6,564,211 B1 | 5/2003 | Andreev et al. |
| 6,633,865 B1 | 10/2003 | Liao |
| 6,636,849 B1 | 10/2003 | Tang et al. |
| 6,636,956 B1 | 10/2003 | Venkatachary et al. |
| 6,662,287 B1 | 12/2003 | Andreev et al. |
| 6,664,838 B1 | 12/2003 | Talledo |
| 6,691,124 B2 | 2/2004 | Gupta et al. |
| 6,694,323 B2 | 2/2004 | Bumbulis |
| 6,697,276 B1 | 2/2004 | Pereira et al. |
| 6,757,779 B1 | 6/2004 | Nataraj et al. |
| 6,768,739 B1 | 7/2004 | Kobayashi et al. |
| 6,778,530 B1 | 8/2004 | Greene |
| 6,831,850 B2 | 12/2004 | Pereira et al. |
| 6,839,800 B2 | 1/2005 | Stark |
| 6,856,558 B1 | 2/2005 | Proebsting et al. |
| 6,934,795 B2 | 8/2005 | Nataraj et al. |
| 6,941,314 B2 | 9/2005 | Andreev et al. |
| 6,944,709 B2 | 9/2005 | Nataraj et al. |
| 7,016,904 B1 | 3/2006 | Grove et al. |
| 7,017,021 B2 | 3/2006 | Gupta et al. |
| 7,023,807 B2 | 4/2006 | Michels et al. |
| 7,035,844 B2 | 4/2006 | Andreev et al. |
| 7,047,317 B1 | 5/2006 | Huie et al. |
| 7,076,602 B2 | 7/2006 | Stark et al. |
| 7,107,263 B2 | 9/2006 | Yianilos et al. |
| 7,119,592 B2 * | 10/2006 | Cooper ..................... 327/158 |
| 7,231,383 B2 | 6/2007 | Andreev et al. |
| 7,257,530 B2 | 8/2007 | Yin |
| 7,289,979 B2 | 10/2007 | Wilson |
| 7,292,162 B2 | 11/2007 | Somasundaram |
| 2002/0089937 A1 | 7/2002 | Venkatachary et al. |
| 2003/0093613 A1 | 5/2003 | Sherman |
| 2004/0030686 A1 | 2/2004 | Cardno et al. |
| 2004/0193619 A1 | 9/2004 | Venkatachary et al. |
| 2004/0249803 A1 | 12/2004 | Vankatachary et al. |

OTHER PUBLICATIONS

"B-Trees: Balanced Tree Data Structures" pp. 1-8 (believed prior to Nov. 27, 2006) <http://www.bluerwhite.org/btree/>.

Chang et al. "Dynamic Routing Tables using Augmented Balanced Search Tree" *National Cheng Kung University and I-Shou University* (35 pages)(believed prior to Jul. 23, 2004).

Choudhury et al. "A New Buffer Management Scheme for Hierarchical Shared Memory Switches" *IEEE/ACM Transactions on Networking (TON)* 5(5):728-738 (1997).

Djordjevic et al. "A Hierarchical Memory System Environment" *Proceedings of the 1988 Workshop on Computer Architecture Education WCAE* (6 pages)(1998).

Lu et al. "A B-Tree Dynamic Router-Table Design" pp. 1-27 (believed prior to Nov. 27, 2006).

O'Connor et al. "The iFlow Address Processor " 2001 *IEEE Micro* pp. 16-23 (2001).

Suri et al. "Multiway Range Trees: Scalable IP Lookup with Fast Updates" (5 pages)(believed prior to Nov. 27, 2006) http://www.cs.edu/~Varghese/PAPERS/globecome2001.pdf.

\* cited by examiner

FIG. 5(a) DDRCKP

FIG. 5(b) DDRCKN

FIG. 5(c) DDRCKN delayed by <0.5T (case 1)

FIG. 5(d) DDRCKN delayed by >0.5T (case 2)

DDR MEMORY SYSTEM FOR MEASURING A CLOCK SIGNAL BY IDENTIFYING A DELAY VALUE CORRESPONDING TO A CHANGED LOGIC STATE DURING CLOCK SIGNAL TRANSITIONS

FIELD OF THE INVENTION

This invention relates to clock signals and circuits and, more specifically, to circuits and methods for measuring a clock signal.

BACKGROUND OF THE INVENTION

Circuits and methods for measuring a clock signal, for example, for measuring a period of a clock signal, are widely used in many applications. For example, circuits and methods for generating a compensated percent-of-clock period delay signal may be used to produce a delayed data strobe signal that is used to capture read data that is provided along with and edge aligned to the data strobe signal from a Double Data Rate (DDR) Synchronous Dynamic Random Access Memory (SDRAM). More specifically, a DDR SDRAM can transfer data on both rising and falling clock edges at relatively high rates. Such rates may result in a very narrow data valid window. Moreover, the read data strobe signals generally are edge aligned with the data signals rather than being edge centered. Thus, to be used as a clock for the data capture registers, the data strobe signals should be phase shifted by about 90°. However, the absolute value of the delay may change depending on the clock speed and may also shift depending on the process, voltage and/or temperature conditions under which the device is operating. Thus, it may be desirable for the absolute value of the delay to be adjustable, so that it represents the same percentage of the clock period when the clock frequency changes and under varying process/voltage/temperature conditions. Accordingly, circuits for measuring a period of a clock signal that can generate a compensated percentage-of-clock period delay signal may be highly desirable.

U.S. Pat. No. 6,664,838 to Talledo, entitled Apparatus and Method far Generating a Compensated Percent-of-Clock Period Delay Signal, assigned to the assignee of the present invention, the disclosure of which is hereby incorporated entirely herein by reference as if set forth fully herein, describes an apparatus and method for generating a compensated percent-of-clock period delay signal. A first circuit determines how many delay elements a clock signal passes through during one period of the clock signal. A second circuit passes a signal to be delayed through the same number of delay elements according to information received from the first circuit. The ratio of the values of delay elements in the first and second circuits determines the percent-of-clock period that the passed signal is delayed. Since the clock signal is relatively insensitive to reference voltage and temperature variations as compared to the delay elements, the percent-of-clock period is maintained as more or less delay elements are passed through during a period of the clock signal. See the Abstract of U.S. Pat. No. 6,664,838.

U.S. Pat. No. 6,856,558 to Proebsting et al., entitled Integrated Circuit Devices Having High Precision Digital Delay Lines Therein, assigned to the assignee of the present invention, the disclosure of which is hereby incorporated entirely herein by reference as if set forth fully herein, describes integrated circuit delay devices that include a digital delay line that is configured to provide a percent-of-clock period delay to a timing signal accepted at an enabled one of a plurality of injection ports thereof. The digital delay line may be responsive to an injection control signal having a value that sets a length of the delay by specifying a location of the enabled one of the plurality of injection ports, with the end of the delay line being a fixed output port. A delay line control circuit is also provided that is responsive to a clock signal having a period from which the percent-of-clock period delay is preferably measured. The delay line control circuit is configured to generate the injection control signal by counting multiple cycles of a high frequency ring oscillator signal having a period less than, and typically substantially less than, the clock period, over a time interval having a duration greater than, and typically substantially greater than, the clock period. The ring oscillator signal may be generated by a ring oscillator having a relatively small number of stages and the time interval may be sufficiently long so that a large number of cycles of the ring oscillator signal may be counted over many periods of the clock signal. See the Abstract of U.S. Pat. No. 6,856,558.

SUMMARY OF THE INVENTION

Circuits for measuring a clock signal according to some embodiments of the present invention include a variable digital delay line that is configured to delay the clock signal by variable amounts in response to variable values of a digital control word that are applied thereto, to produce a variably delayed clock signal. A capture stage is responsive to the variably delayed clock signal and to the clock signal to capture a logic state of the variably delayed clock signal during transitions of the clock signal. A controller is configured to generate the variable values of the digital control word that are applied to the variable digital delay line and to identify a value of the digital control word in response to the capture stage capturing a change in the logic state of the variably delayed clock signal during a transition of the clock signal. In some embodiments, the value of the digital control word that was identified provides a measurement of the clock signal and, in some embodiments, provides an indication of the period of the clock signal. More specifically, in some embodiments, an indication of a compensated percent-of-clock period may be provided and, in some embodiments, a compensated indication of approximately 50% of the clock period may be provided.

In some other embodiments, the controller is configured to repeatedly cycle through at least a subset of the variable values of the digital control word by sequentially increasing from a minimum value and/or sequentially decreasing from a maximum value. The controller may be also be configured to post-process the value of the digital control word that is identified, for example by averaging a plurality of values of the digital control word that are identified. In other embodiments of post-processing, the measured period of the clock signal is not indicated or changed until a plurality of consecutive values, such as eight values, of the digital control word that are identified, are identical.

In some embodiments, a metastability filtering stage also may be provided that is responsive to the capture stage and is configured to reduce metastability in the change in the logic state of the variably delayed clock signal during a transition of the clock signal that is captured by the capture stage. In these embodiments, the controller is responsive to the metastability filtering stage. Moreover, in some embodiments, the capture stage is responsive to the clock signal by being clocked by a complement of the clock signal.

Some embodiments of the invention may also be used with a second variable digital delay line that is responsive to the value of the digital control word that was identified by the controller and is configured to delay a data strobe signal in response thereto. The second delay line may be part of a double data rate memory that is responsive to the clock signal and is configured to generate read data, and that includes a read data latch that is responsive to the read data and is clocked by the second delay line. In some of these embodiments, the first and second delay lines may comprise a same circuit configuration but may use different numbers of stages of the same circuit configuration.

Other circuits for measuring a clock signal according to other embodiments of the present invention include a variable digital delay line that is coupled to the clock signal and is responsive to a digital control word. A first flip-flop is responsive to the variable digital delay line and is clocked by a complement of the clock signal. A controller is responsive to the first flip-flop and is configured to cycle through values of the digital control word and to identify a value of the digital control word responsive to the first flip-flop changing state. In other embodiments, a second flip-flop may be responsive to the first flip-flop and also may be clocked by the complement of the clock signal. The controller may then be responsive to the second flip-flop and may be configured to cycle through the values of the digital control word to identify a value of the digital control word responsive to the second flip-flop changing state. The controller may also be configured to repeatedly cycle through a subset of the values of the digital control word, and to post-process, such as by averaging or repeated counting, as was described above. The circuit may be used in conjunction with a second delay line that is part of a double data rate memory that includes a read latch as was also described above.

Methods of measuring a clock signal according to some embodiments of the present invention comprise variably delaying the clock signal over a range of delay values until the variably delayed clock signal changes logic state during a transition of the clock signal, so that the delay value corresponding to the changed logic state provides a measure of the clock signal. For example, a measure of the period of the clock signal, such as a compensated percent-of-clock period may be provided. Other embodiments can variably delay the clock signal by repeatedly cycling through a range of delay values by sequentially increasing from a minimum value and/or sequentially decreasing from a maximum value. Other methods according to embodiments of the present invention can reduce metastability in the logic state of the variable delay clock signal during a transition of the clock signal. Post-processing may also be provided.

Finally, double data rate memory systems may also be provided according to other embodiments of the present invention. These double data rate memory systems may include a double data rate memory that is responsive to a clock signal and is configured to generate read data and a read data strobe signal. A clocked read data latch is responsive to the read data. A first variable digital delay line is configured to delay the read data strobe signal in response to a digital delay control signal, and to clock the clocked read data latch with the read data strobe signal that is delayed. A clock period measurement system is responsive to the clock signal to generate a delay measurement value. Finally, an adjustment system is responsive to the delay measurement value and is configured to adjust the delay measurement value to produce the digital delay control signal. The clock period measurement system comprises a second variable digital delay line that is coupled to the clock signal and is responsive to a digital control word, a flip-flop that is responsive to the second variable digital delay line and is clocked by a complement of the clock signal, and a controller that is responsive to the flip-flop and is configured to cycle the digital control word and to identify a value of the digital control word responsive to the flip-flop changing state, to provide the delay measurement value. In some embodiments, the first and second variable digital delay lines may have a same circuit configuration but a different number of stages.

DETAILED DESCRIPTION

Figure 1:
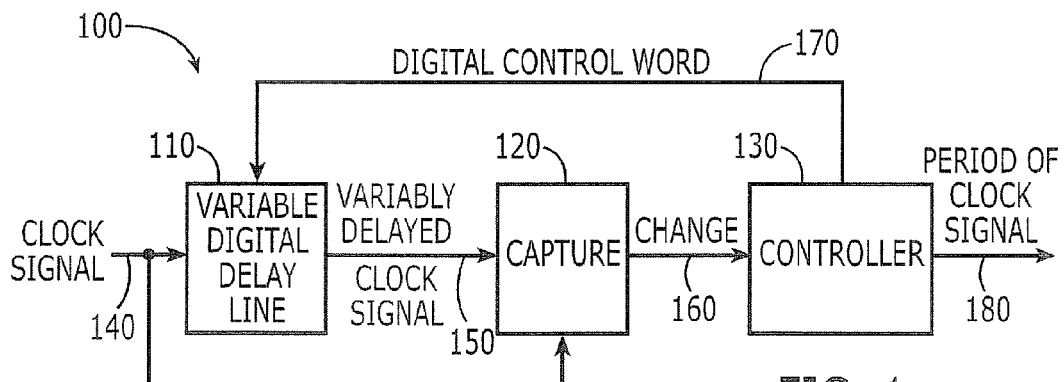
FIG. 1 is a block diagram of circuits and methods for measuring a clock signal according to various embodiments of the present invention.

The present invention now will be described more fully hereinafter with reference to the accompanying drawings, in which illustrative embodiments of the invention are shown. However, this invention may be embodied in many different forms and should not be construed as limited to the embodiments set forth herein. Rather, these embodiments are provided so that this disclosure will be thorough and complete, and will fully convey the scope of the invention to those skilled in the art.

It will be understood that when an element is referred to as being "coupled", "connected" or "responsive" to another element (and variants thereof), it can be directly coupled, connected or responsive to the other element, or intervening elements may also be present. In contrast, when an element is referred to as being "directly coupled", "directly connected" or "directly responsive" to another element (and variants thereof), there are no intervening elements present. Like numbers refer to like elements throughout. As used herein the term "and/or" includes any and all combinations of one or more of the associated listed items and may be abbreviated by "/".

It will also be understood that, although the terms first, second, etc. may be used herein to describe various elements, these elements should not be limited by these terms. These terms are only used to distinguish one element from another element. Moreover, when used in conjunction with a signal name, the suffixes "P" and "N" recite positive and negative, i.e., complementary, versions of a signal, and need not indicate a specific signal polarity.

The terminology used herein is for the purpose of describing particular embodiments only and is not intended to be limiting of the invention. As used herein, the singular forms "a", "an" and "the" (and variants thereof) are intended to include the plural forms as well, unless the context clearly indicates otherwise. Moreover, the term "double" includes higher multipliers as well. It will be further understood that the terms "comprises," "comprising," "includes" and/or "including" (and variants thereof) when used herein, specify the presence of stated features, steps, operations, elements, and/or components, but do not preclude the presence or addition of one or more other features, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The present invention is described in part below with reference to block diagrams and/or flowcharts of methods, systems and devices according to embodiments of the invention. It will be understood that a block of the block diagrams or flowcharts, and combinations of blocks in the block diagrams or flowcharts, may be implemented at least in part by logic and/or processor (general purpose and/or special purpose) circuits that can execute a stored program to provide means, modules, devices and/or methods for implementing the functions/acts specified in the block diagram block or blocks. Accordingly, a given block or blocks of the block diagrams and/or flowcharts provides support for methods, devices and/or systems (structural and/or means-plus-function).

It should also be noted that in some alternate implementations, the functions/acts noted in the flowcharts may occur out of the order noted in the flowcharts. For example, two blocks shown in succession may in fact be executed substantially concurrently or the blocks may sometimes be executed in the reverse order, depending upon the functionality/acts involved. Finally, the functionality of one or more blocks may be separated and/or combined with that of other blocks. It will also be understood that, in many systems that are already equipped with some form of microprocessor-based computational capability, at least some blocks of the block diagrams may be embedded within operating and/or application programs that execute on the microprocessor.

FIG. 1 is a block diagram of circuits and/or methods 100 for measuring a period of a clock signal according to some embodiments of the present invention. As is well known to those having skill in the art, a clock signal is generally used in synchronous digital circuits to coordinate the actions of two or more circuits. A clock signal oscillates between a high and a low state, generally with a 50% duty cycle, and is usually a square wave. A "period" means the time between recurring edges of a clock signal, i.e., the time between recurring rising edges or between recurring falling edges of a clock signal. Some embodiments of the present invention can provide a measurement of a period of a clock signal by generating a percent-of-clock delay signal that can be compensated by providing a desired percent-of-clock period delay signal, notwithstanding changes in the clock frequency and/or notwithstanding varying process/voltage/temperature conditions under which the circuit was fabricated or operates.

Referring now to FIG. 1, a variable digital delay line 110 is configured to delay the clock signal 140 by variable amounts in response to variable values of a digital control word 170 that are applied thereto, to produce a variably delayed clock signal 150. A capture stage 120 is responsive to the variably delayed clock signal 150 and to the clock signal 140 (for example, to the complement of the clock signal), to capture a logic state of the variably delayed clock signal 150 during transitions of the clock signal 140. A controller 130 is also provided that may be embodied by logic and/or processor circuits that may execute a stored program and/or that may embody a state machine. The controller 130 is configured to generate the variable values of the digital control word 170 that are applied to the variable digital delay line 110 and to identify a value of the digital control word 170 in response to the capture stage 120 capturing a change 160 in the logic state of the variably delayed clock signal 150 during a transition of the clock signal 140, to thereby indicate the period of the clock signal 180.

In some embodiments, the capture stage 120 may be embodied by a flip-flop, such as a D-type flip-flop, that is responsive to the variable digital delay line 110, and is clocked by a complement of the clock signal 140. As is well known to those having skill in the art, a D-type flip-flop is a flip-flop or latch in which the output Q takes on the state of the D input at the time of a rising clock edge, and retains this state at other times. As will also be described below, the signal 180 may be post-processed to provide a signal that is used, for example, in a Double Data Rate (DDR) memory device.

Figure 2:
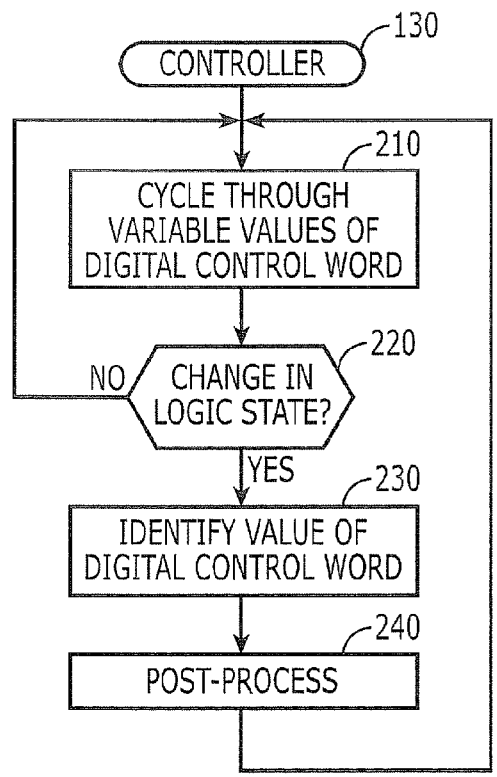
FIG. 2 is a flowchart of operations that may be performed to measure a clock signal according to various embodiments of the present invention.

FIG. 2 is a flowchart of operations that may be performed by a controller, such as the controller 130 of FIG. 1, according to various embodiments of the present invention. As shown in FIG. 2, the controller is configured to repeatedly cycle through at least a subset of the variable values of the digital control word 170, by sequentially increasing from a minimum value and/or by sequentially decreasing from a maximum value. The digital control words 170 continue to be cycled until a change 160 in the logic state of the variably delayed clock signal 150 is captured by the capture stage 120 during a transition of the clock signal 140, as indicated at Block 220. A value of the digital control word 170 that corresponds to the change in the logic state of Block 220 is identified at Block 230, to measure the clock signal, for example to indicate 50% of the period of the clock signal.

Post-processing may be performed at Block 240 to obtain a desired period measurement signal. For example, a plurality of values of the digital control signal may be averaged. Alternatively, a valid signal may not be indicated until a predetermined number (e.g., 8) of identical values of the digital control word are obtained. Operations then continue by again cycling through the variable values of the digital control word. Accordingly, FIG. 2 illustrates embodiments of the present invention that measure a clock signal by variably delaying the clock signal over a range of delay values until the variably delayed clock signal changes logic state during a transition of the clock signal, so that the delay value corresponding to the changed logic state provides a measure of the clock signal, for example a percent-of-clock period signal.

Additional embodiments of the present invention will now be described in connection with systems and/or methods for DDR memory clock centering. Clock centering may be used in a data capture stage of a DDR memory controller in some embodiments of the present invention. It will be understood that the term "DDR" also includes DDR2 and higher rate memory devices.

As is well known to those having skill in the art, DDR2 DRAM memory devices transfer data on both rising and falling clock edges at clock rates of, for example, 200-333 MHz, and that 400 MHz and higher rates may also be used. Such rates may result in a very narrow data valid window. For example, in a DDR2-667, having a 333 MHz clock, the data window may be 1.5 nanoseconds minus jitter, bit-to-bit skew and rise-to-fall skew, so that the data window may be as small as only a few hundred picoseconds. This data window may be further reduced by other factors inside the controller itself, including but not limited to the capture flip-flop setup/hold times and/or the clock tree skew.

Moreover, the complementary read data strobe signals of a DDR2 controller, commonly referred to as DQS and DQSN, are edge-aligned with the data signals, commonly referred to as DQ, rather than being edge-centered therewith. Therefore, to be used as a clock for the data capture registers, DQS and DQSN should be phase shifted by about 90°. However, the absolute length of the delay may change depending on the clock speed. Ideally, the data strobe, as seen at the clock pins of the capture register is placed in the middle of the data window measured at the data pins of the same registers, after accounting for the register set up and hold times. Moreover, the DQS strobe shifting should also be stable under varying Process/Voltage/Temperature (PVT) conditions. Thus, the absolute value of the delay should be self-compensating, so that it represents the same percentage of the clock period when the clock frequency changes, despite changing PVT conditions.

Conventional DDR DRAM controllers include a digital delay having a number of identical delay elements. By selecting the output from one of the elements as the delay line output, the total delay may be controlled. However, in order to control the delay, the number of elements that represent a desired percentage of the clock period must be found and conventionally must be dynamically adjusted when the PVT conditions change and/or the clock speed changes. In sharp contrast, some embodiments of the present invention can provide a desired delay and may maintain the desired percent-of-clock period delay, notwithstanding PVT and/or clock speed changes.

Figure 3:
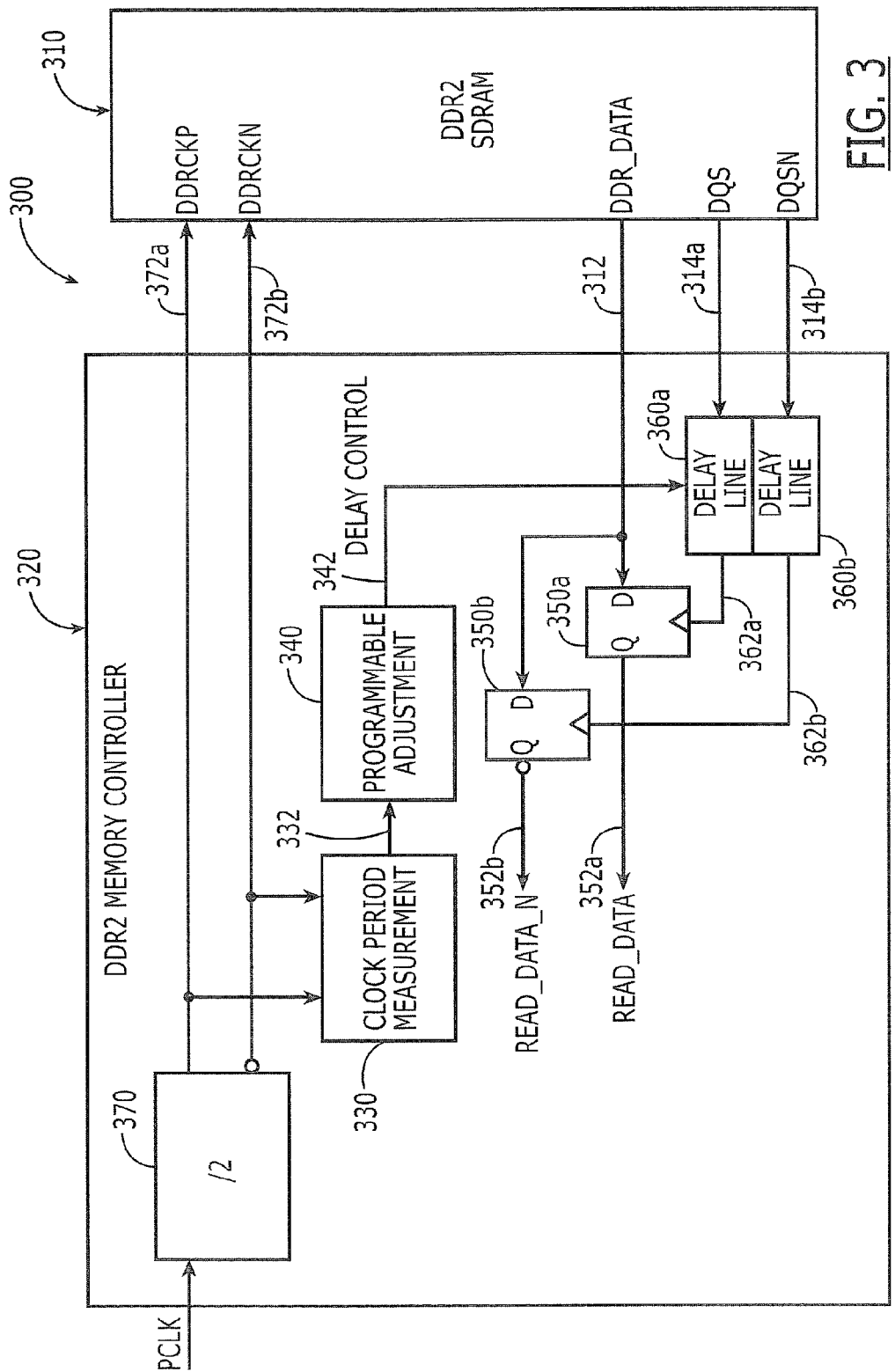
FIG. 3 is a block diagram of a memory system read path that includes circuits/methods for measuring a clock signal according to various embodiments of the present invention.

FIG. 3 is a block diagram of a DDR data read path that includes clock period measurement systems/methods according to various embodiments of the present invention. As shown, these DDR systems/methods 300 may include a DDR2 SDRAM 310 and a DDR2 memory controller 320 that may be embodied in two separate integrated circuits or may be combined at least in part in a single integrated circuit. The system clock PCLK may have a frequency that is two times higher than needed for the DDR2 DRAM operation. In this case, the complementary clock signals DDRCKP (372*a*) and DDRCKN (372*b*) may be generated by dividing PCLK frequency by two using a divider 370. Thus, the clock signal DDRCKP 372*a* may correspond to the clock signal 140 of FIG. 1. The DQS and DQSN data strobes 314*a*, 314*b* from the DRAM 310 are delayed using a pair of delay lines 360*a*, 360*b*, and then used as clocks 362*a*, 362*b* to register or latch the read data DDR_DATA 312 in a pair of latches 350*a*, 350*b*, to generate READ_DATA and READ_DATA_N 352*a*, 352*b*. Thus, the read data latches 350*a*, 350*b* are clocked by the delay lines 360*a*, 360*b*. The clock period management system/method 330 generates a signal 332 indicating a period of the clock signal 372*a*, which may correspond to signal 180 of FIG. 1. A programmable adjustment system/method 340 may adjust this signal as described in detail below, to provide a desired delay control signal 342 that is applied to the delay lines 360*a*, 360*b*.

Accordingly, FIG. 3 illustrates double data rate memory systems according to various embodiments of the invention, that include a double data rate memory 310 that is responsive to a clock signal 372*a*/372*b*, and is configured to generate read data 312 and a read data strobe signal 314*a*/314*b*. A clocked read data latch 350*a*/350*b* is responsive to the read data 312. A first variable digital delay line 360*a*/360*b* is configured to delay the read data strobe signal 314*a*/314*b* in response to a digital delay control signal 342, and to clock the clocked read data latch 350*a*/350*b* with the read data strobe signal 314*a*/314*b* that is delayed 362*a*/362*b*. A clock period measurement system 330 is responsive to the clock signal 372*a*/372*b* to generate a delay measurement value 332. An adjustment system 340 is responsive to the delay measurement value 332 and is configured to adjust the delay measurement value 332 to produce the digital delay control signal 342. The clock period measurement system may be configured as was described above in connection with FIGS. 1 and 2.

Other embodiments of clock period measurement systems/methods according to various embodiments of the present invention will now be described in connection with FIGS. 4-7 below. By finding and continuously tracking a ratio of the clock period to a single element delay, a desired percent-of-clock period delay may be created using matching delay elements. Moreover, embodiments of the invention may use standard library cells and may not need custom design. Finally, the delay tracking can be continuous and automatic according to some embodiments of the present invention. Host processor intervention may not be needed, unless an adjustment needs to be done to the circuit operation, e.g., a different percentage of clock period is desired.

Figure 4:
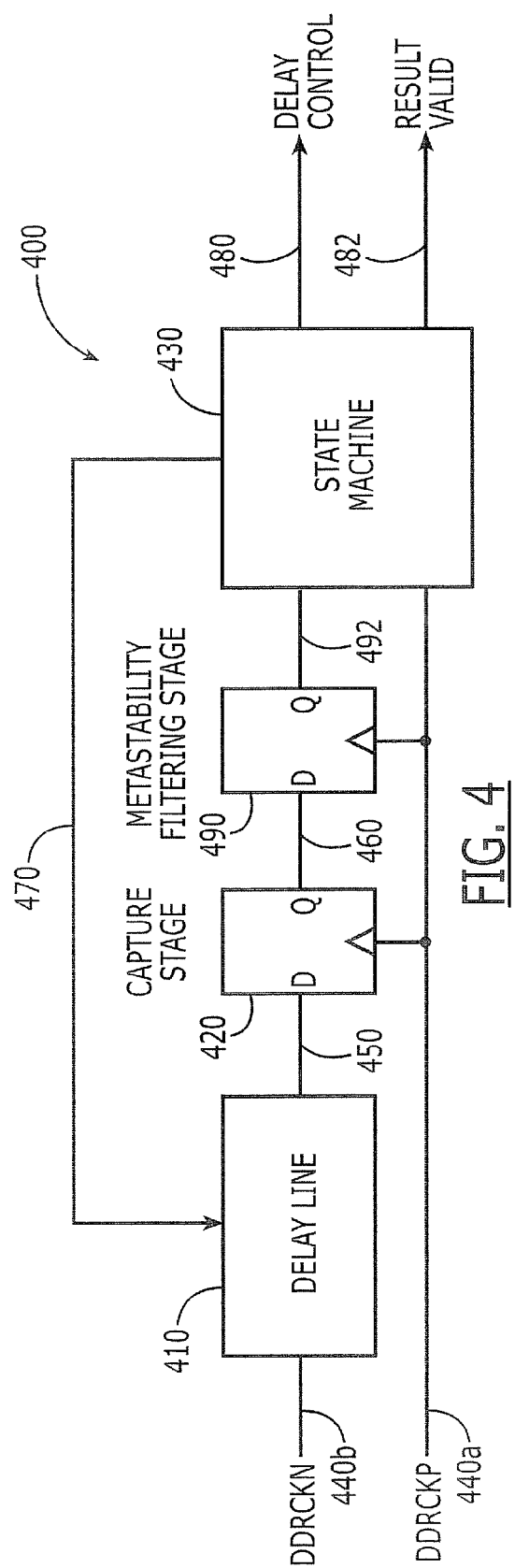
FIG. 4 is a block diagram of circuits and methods for measuring a clock signal according to other embodiments of the present invention.

FIG. 4 is a block diagram of circuits and methods for measuring a period of a clock signal according to other embodiments of the present invention. These circuits/methods 400 may correspond to Block 330 of FIG. 3 and to systems/methods 100 of FIG. 1.

Referring now to FIG. 4, a variable digital delay line 410 is provided that is configured to delay the clock signal 440*b*, which may correspond to clock signal 372*b* of FIG. 3 or clock signal 140 of FIG. 1, by variable amounts, in response to variable values of a digital control word 470, which may correspond to the digital control word 170 of FIG. 1, that are applied to the delay line 410, to produce a variably delayed clock signal 450, which may correspond to the variable delayed clock signal 150 of FIG. 1. A capture stage 420, which may correspond to the capture stage 120 of FIG. 1, may be embodied as a D-type flip-flop that is clocked by the complementary clock signal DDRCKP 440*a*, which may correspond to signal 372*a* of FIG. 3. The capture stage 420 is responsive to the variably delayed clock signal 450 and to the complement of the clock signal 440*a*, to capture a logic state of the variably delayed clock signal 450 during transitions of the clock signal.

Still referring to FIG. 4, a controller, which may be embodied as a state machine 430 and which may correspond to the controller 130 of FIG. 1, is configured to generate the variable values of the digital control word 470 that are applied to the digital delay line 410 and to identify a value of the digital control word 470, in response to the capture stage 420 capturing a change 460 in the logic state of the variably delayed clock signal 450 during a transition of the clock signal 440*a*, to thereby indicate the period of the clock signal 440*a*. General operations of the state machine 430 were described above in connection with FIG. 2. Other embodiments of the state machine will be described in connection with the timing diagrams of FIGS. 5(*a*)-5(*d*) and the state diagram of FIG. 7.

Figure 5:
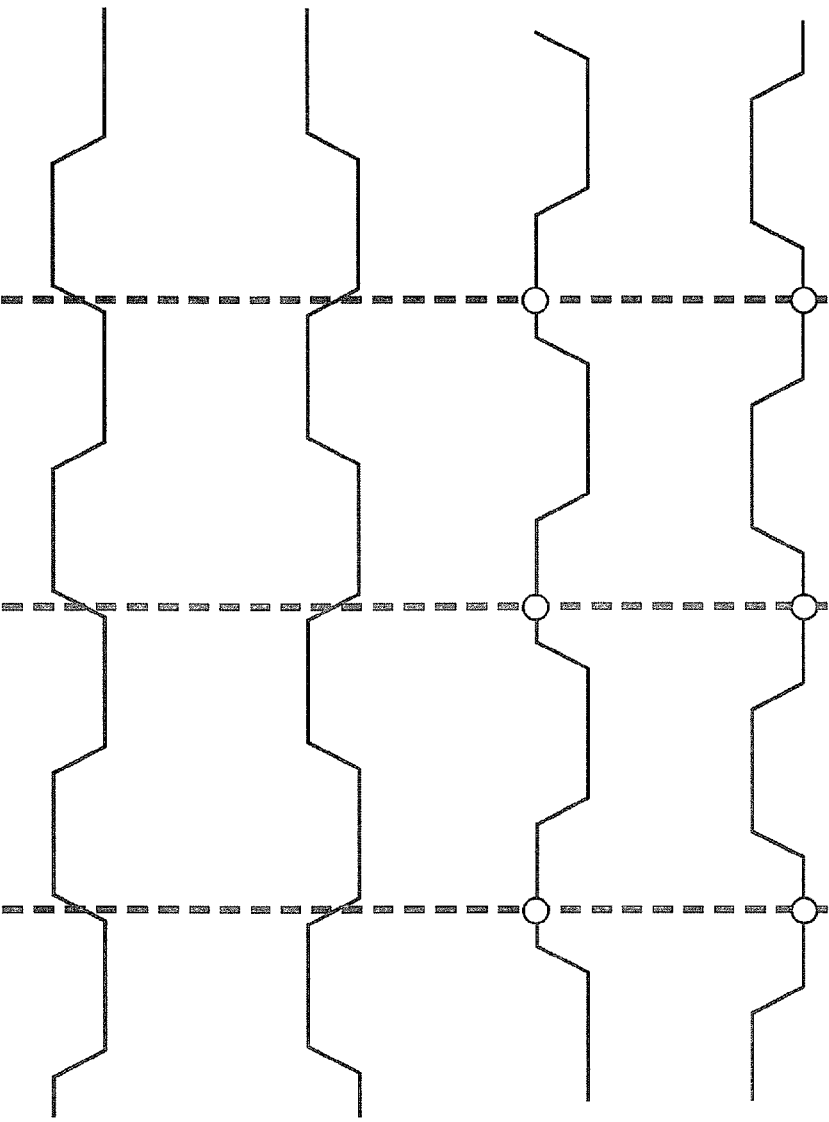
FIGS. 5(a)-5(d) are timing diagrams illustrating operations of FIG. 4.

Referring now to FIGS. 4 and 5(*a*)-5(*d*), the clock period measurement state machine 430 may be configured to repeatedly cycle through at least a subset of the variable values of the digital control word 470. In some embodiments, the state machine 430 is configured to sequentially increase from a minimum value and/or to sequentially decrease from a maximum value. In yet other embodiments, the state machine 430 continuously cycles through all delay values from 0 to the maximum value. At the beginning of the cycle, as shown at FIG. 5(*c*), when the delay values are small, the capture stage 420 registers logic HIGH state of the delayed DDRCKN signal 450 on every rising edge of DDRCKP (FIG. 5(a)), as shown by the three dashed lines in FIGS. 5(a)-5(d), and referred to in FIG. 5(c) as "case 1". However, when the delay reaches approximately 50% of the clock period (0.5T), the capture stage 420 begins to register LOW state of the delay DDRCKN signal, as shown in FIG. 5(d), and referred to as "case 2". Thus, the capture stage 420 captures a change in the logic state of the variable delayed clock signal 450 shown at FIG. 5(c) and FIG. 5(d) during a transition of the clock signal shown at FIG. 5(a) and FIG. 5(b), to thereby provide a measure of the period of the clock signal.

Figure 6:
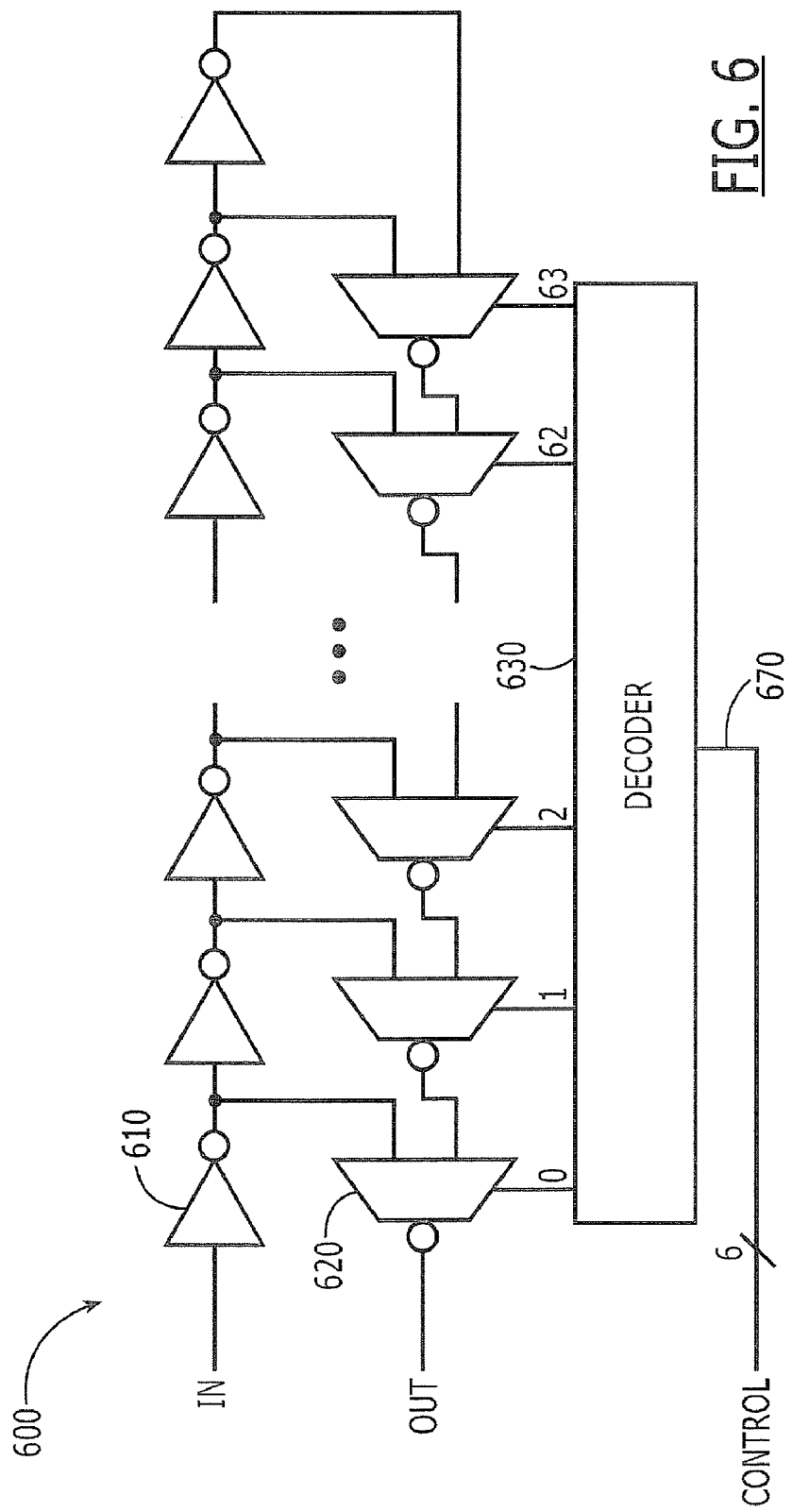
FIG. 6 is a block diagram of a variable digital delay line that may be employed in embodiments of the present invention.

FIG. 6 is a block diagram of a variable digital delay line 600, which may correspond to the variable digital line 410 of FIG. 4 or 110 of FIG. 1. Moreover, in some embodiments of the invention, the same circuit configuration of a variable digital delay line is also used for the delay lines 360a, 360b that delays the data strobe signals 314a, 314b to clock the data registers 350a, 350b. Differing number of stages may be used, however, as will be described below.

Referring now to FIG. 6, these digital delay lines include a plurality of inverters 610 and a plurality of multiplexers 620. The inverters 610 are serially connected, and the multiplexers 620 are also serially connected as shown. The multiplexers 620 may be selected by a decoder 630 that is responsive to the control word 670, which may correspond to the control word 170 of FIGS. 1 and 470 of FIG. 4. In FIG. 6, an embodiment is shown wherein a six-bit control word 670 is used to provide one of 64 delay values by selecting an inverter chain and multiplexer chain to define the delay. It will be understood that smaller or larger numbers of inverters 610 and multiplexers 620 may also be used. Moreover, other embodiments of digital delays lines may be used in other embodiments of the present invention.

In order to allow more stable measurements, some embodiments of the invention can optionally post-process the state change signal 460/160 that is captured by the capture stage 120/420. For example, in some embodiments, the value of the digital control word is captured many times, for example 8, and then averaged. In other embodiments, a valid digital control word is not asserted until the same digital control word is captured for a plurality of consecutive times, for example 8 consecutive times. Moreover, in other embodiments, an additional metastability filtering stage 490 may be provided. The metastability filtering stage 490 may include a second D-type flip-flop which can provide additional filtering for a metastable signal, i.e., a signal that is stuck or noisy. The delay control output 480 of the state machine 430 can be provided by a register in the state machine 430, which contains the first delay value that captured the LOW state of the delayed DDRCKN signal 460 in all of successive multiple capture cycles. A Result Valid strobe 482 may be asserted when the measurement algorithm has reached this state. For example, the result valid signal may not be asserted until after eight identical values in a row are captured.

Note that, in some embodiments, the delay control signal 342/480 is latched the first time the above condition is met. The subsequent capture results need not affect the delay control signal 342 until the entire measurement cycle is reinitialized, at which the time delay control 342/480 signal and result valid signal 482 may be reset.

If applied to another variable delay line, the measured value can result in half a clock period shift between its input and output. To achieve a desired 25% of the clock period phase shift, the delay control value can be divided by two by shifting it right by one bit. This shifting may be performed by a programmable adjustment Block 340. Other shifting may be provided as desirable. Moreover, while the reference delay line 110/410 may have 64 stages, the slave delay lines 360a, 360b may have only 32 stages, because they may only need to delay by 25% of the clock period phase shift. However, as described above, in some embodiments, they have the same circuit configuration. The programmable adjustment Block 340 may also compensate for other possible sources of errors, such as the capture register setup time. Thus, the programmable adjustment Block 340 can add or subtract a predetermined constant or variable value from the measured result before applying as the delay control signal 342 to the DQS/DQSN delay lines 360a, 360b. Other post-processing operations also may be performed.

Figure 7:
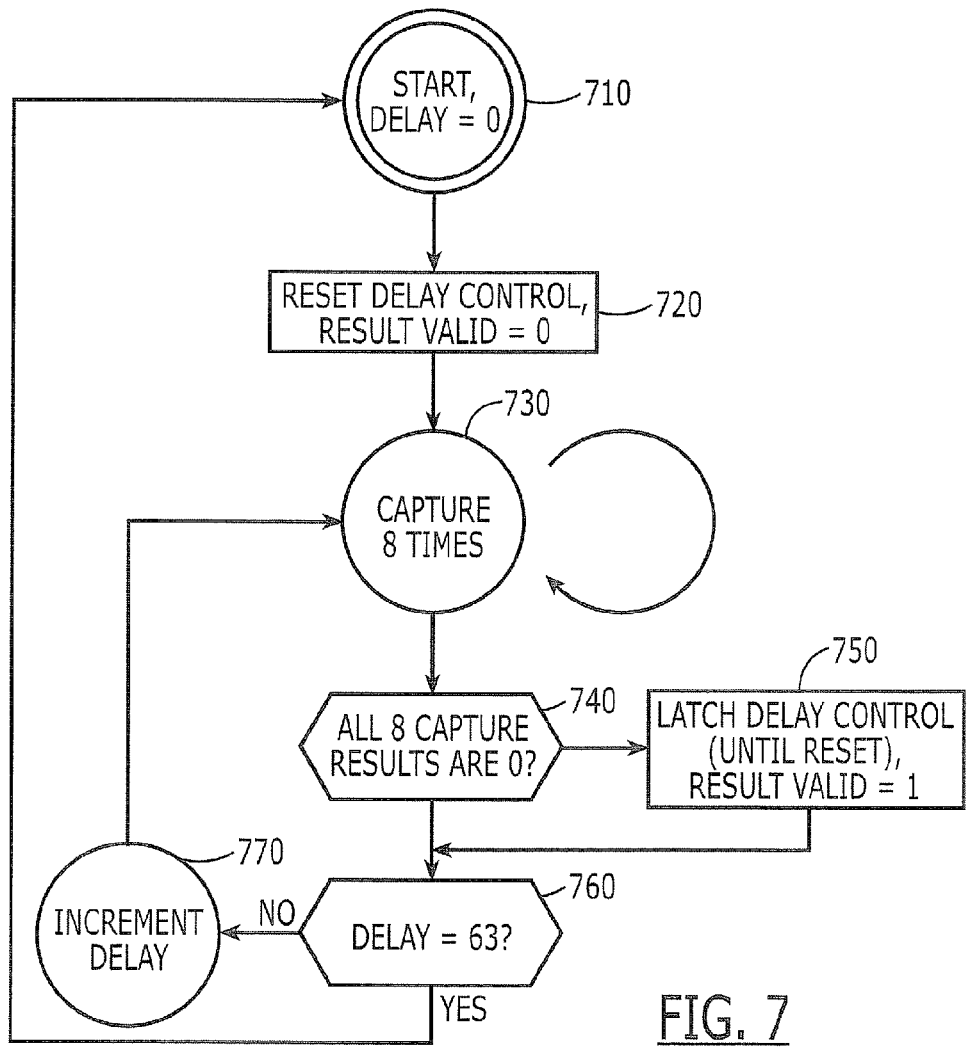
FIG. 7 is a state diagram of a state machine that may be employed as a controller to measure a clock signal according to various embodiments of the present invention.

FIG. 7 is a state diagram for a state machine 430 of FIG. 4 according to various embodiments of the present invention. At Block 710, the state machine begins by setting the digital control word 670/470/170 to 0, and by resetting the delay control result valid line 482 at Block 720. Data is then captured eight times at Block 730, and if all capture results are 0 at Block 740, then the delay control signal 480 is latched until reset at Block 740, and the result valid signal 750 is set. If all eight capture results are not 0 at Block 740, and the delay is not a maximum at Block 760, then the delay is incremented at Block 770 and then the delay is again captured eight times at Block 730. When the delay hits a maximum at Block 760, operations again begin at Block 710. Other state machines may be employed in other embodiments of the present invention.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A double data rate memory system comprising:
    a double data rate memory that is responsive to a clock signal and is configured to generate read data and a read data strobe signal;
    a clocked read data latch that is responsive to the read data;
    a first variable digital delay line that is configured to delay the read data strobe signal in response to a digital delay control signal and to clock the clocked read data latch with the read data strobe signal that is delayed;
    a clock period measurement system that is responsive to the clock signal to generate a delay measurement value; and
    an adjustment system that is responsive to the delay measurement value and is configured to adjust the delay measurement value to produce the digital delay control signal;
    wherein the clock period measurement system comprises:
        a second variable digital delay line that is coupled to the clock signal and is responsive to a digital control word;
        a flip-flop that is responsive to the second variable digital delay line and is clocked by a complement of the clock signal; and
        a controller that is responsive to the flip-flop and is configured to cycle the digital control word and to identify a value of the digital control word responsive to the flip-flop changing state to provide the delay measurement value.

2. A system according to claim 1 further comprising:
    a metastability filtering stage that is responsive to the flip-flop and is configured to reduce metastability in the change in the logic state of the variably delayed clock signal during a transition of the clock signal that is captured by the flip-flop, the controller being responsive to the metastability filtering stage.

3. A system according to claim 1 wherein the flip-flop is a first flip-flop, the system further comprising:

a second flip-flop that is responsive to the first flip-flop and is clocked by the complement of the clock signal;

wherein the controller is responsive to the second flip-flop and is configured to cycle through values of the digital control word and to identify a value of the digital control word responsive to the second flip-flop changing state.

4. A system according to claim 1 wherein the controller is configured to repeatedly cycle through at least a subset of the values of the digital control word, by sequentially increasing from a minimum value and/or sequentially decreasing from a maximum value.

5. A system according to claim 1 wherein the controller is further configured to post-process the value of the digital control word that is identified.

6. A system according to claim 1 wherein the controller is further configured to average a plurality of values of the digital control word that are identified.

7. A system according to claim 1 wherein the first and second variable digital delay lines comprise a same circuit configuration.

\* \* \* \* \*